United States Patent
Kinugasa et al.

(10) Patent No.: US 9,287,307 B2
(45) Date of Patent: Mar. 15, 2016

(54) CHIP SIZE PACKAGE (CSP)

(71) Applicant: Sony Corporation, Tokyo (JP)

(72) Inventors: Yukihisa Kinugasa, Tokyo (JP);
Toshihiro Furusawa, Kanagawa (JP);
Yoshiteru Kamatani, Kanagawa (JP);
Yoshihito Higashitsutsumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 5 days.

(21) Appl. No.: 14/186,181

(22) Filed: Feb. 21, 2014

(65) Prior Publication Data
US 2014/0246745 A1 Sep. 4, 2014

(30) Foreign Application Priority Data

Mar. 1, 2013 (JP) ................................. 2013-041030

(51) Int. Cl.
*H01L 23/66* (2006.01)
*H01L 27/14* (2006.01)
*H01L 27/146* (2006.01)

(52) U.S. Cl.
CPC .......... *H01L 27/14618* (2013.01); *H01L 23/66* (2013.01); *H01L 27/14636* (2013.01); *H01L 2224/131* (2013.01); *H01L 2224/16225* (2013.01); *H01L 2224/16227* (2013.01)

(58) Field of Classification Search
CPC .......................... H01L 23/66; H01L 27/14636
See application file for complete search history.

(56) References Cited

U.S. PATENT DOCUMENTS

| | | | |
|---|---|---|---|
| 6,489,676 B2* | 12/2002 | Taniguchi et al. | 257/698 |
| 6,639,299 B2* | 10/2003 | Aoki | 257/531 |
| 6,779,733 B2* | 8/2004 | Akita | G06K 19/07718 235/488 |
| 8,063,846 B2* | 11/2011 | Imaoka et al. | 343/851 |
| 8,547,278 B2* | 10/2013 | Jun | H01Q 3/26 342/368 |

FOREIGN PATENT DOCUMENTS

JP 2004-065574 3/2004

OTHER PUBLICATIONS

David Dyal, Semiconductor Manufacturing, Nov. 1997, 13 pages downloaded from http://www.laits.utexas.edu/~anorman/long.extra/Projects.F97/DAVID/paper.html.*

* cited by examiner

*Primary Examiner* — Evan Pert
(74) *Attorney, Agent, or Firm* — Hazuki International, LLC

(57) ABSTRACT

A chip size package (CSP) includes an antenna for wireless communication, used in signal transmission and reception with external substrates, the antenna being formed as a wiring of a rewiring layer, the rewiring layer being disposed between a silicon layer and solder bumps.

5 Claims, 5 Drawing Sheets

CHIP SIZE PACKAGE (CSP)

CROSS REFERENCES TO RELATED APPLICATIONS

The present application claims priority to Japanese Priority Patent Application JP 2013-041030 filed in the Japan Patent Office on Mar. 1, 2013, the entire content of which is hereby incorporated by reference.

BACKGROUND

The present application relates to a chip size package (CSP), and in particular to a CSP that is capable of meeting needs in terms of larger capacity, downsizing, and power saving of electronic apparatuses.

In recent years, in electronic apparatuses such as a smart phone, a communication system for internal data transmission of the electronic apparatus has been changing from wired communication to wireless communication along with increase in internal communication speed. Therefore, realization of larger-volume data communication using a broadband is expected.

Performing internal communication of the electronic apparatus through the wireless communication may make it possible, for example, to considerably reduce the number of signal wirings on a circuit substrate, and to provide a number of advantages such as downsizing of the substrate and improvement in signal quality by stabilization of a power source and a ground.

For example, a millimeter waveband has been becoming available as a band used in the wireless communication for internal data transmission of the electronic apparatus, and communication using a broadband has been realized. In the wireless communication in the millimeter waveband, attenuation of radio waves easily occurs, which makes the communication distance short. However, the wireless communication in the millimeter waveband is suitable for very close distance communication specialized for the internal communication of the electronic apparatus.

On the other hand, signal transmission and reception are performed through antennae in the wireless communication, and it is important to reduce the installation space of the antennae as much as possible.

For example, in the case of a mobile phone, a rod-like antenna has been initially provided. Then, an antenna has been embedded in the mobile phone. Nowadays an antenna is disposed on a flexible cable wiring provided inside the mobile phone. In this way, transition to space saving has been executed.

In addition, a configuration in which a sensor substrate, an image pickup process control substrate, and a communication substrate are stacked in an axis direction of a main body at intervals of connection terminals, electronic components are mounted with a high density, a part of a side surface of each of the sensor substrate and the image pickup process control substrate is cut out, and an antenna connected to the communication substrate is disposed along the cutout part has been proposed (for example, refer to Japanese Unexamined Patent Application Publication No. 2004-065574).

According to Japanese Unexamined Patent Application Publication No. 2004-065574, a back surface side of the image pickup process control substrate is connected with the communication substrate through connection terminals of solder balls. The electronic components and the like are mounted on both surfaces of the communication substrate to form, for example, a communication module of Bluetooth system. Further, image signals photoelectrically converted by a CMOS sensor may be transmitted to external units through the communication substrate, or cycle of illumination and image pickup may be changed or the like by receiving instruction signals from the units.

SUMMARY

However, electronic apparatuses recently show remarkable progress in terms of downsizing and thickness reduction, and further downsizing in mounting size of the internal circuits and the like is desired. For example, by the technology in Japanese Unexamined Patent Application Publication No. 2004-065574, since the antenna is formed separately from sensor chips and the like, downsizing is limited.

Moreover, for example, as with a mobile phone, in the case where transmission and reception by wireless communication are performed between a terminal and a base station in cells of the base station that are arranged at intervals of several hundred meters to several kilometers, it is unnecessary to consider arrangement of the antenna of the terminal.

However, in the wireless communication in the millimeter waveband in the electronic apparatus, it is necessary to consider directivity of the radio waves. Therefore, the arrangement of the antenna is important.

Further, to determine the arrangement of the antenna, it is necessary to consider a magnitude of inductance, shape capable of increasing antenna efficiency, and the like. However, for example, in the case of an antenna using a flexible flat cable, maintenance of the magnitude of the inductance and the antenna efficiency is limited.

It is desirable to meet needs in terms of large capacity, downsizing, and power saving of an electronic apparatus.

According to an embodiment of the technology, there is provided a chip size package (CSP) including an antenna for wireless communication, used in signal transmission and reception with external substrates. The antenna is formed as a wiring of a rewiring layer, and the rewiring layer is disposed between a silicon layer and solder bumps.

The antenna may be connected to a circuit provided inside the CSP, and the wiring of the rewiring layer configuring the antenna may be formed at a position where the solder bumps are not formed.

The antenna may be connected to a circuit provided outside the CSP, and the wiring of the rewiring layer configuring the antenna may have ends formed at positions where the solder bumps are formed.

The CSP may be mounted on a mounting substrate, and a part of the mounting substrate corresponding to the wiring of the rewiring layer configuring the antenna may be hollowed, and a hole may be provided at the hollowed part.

A horn antenna may be provided at a position corresponding to the hole of the mounting substrate.

The CSP may be configured as an image sensor.

In the CSP according to the embodiment of the technology, the antenna for wireless communication, used in signal transmission and reception with external substrates is provided. The antenna is formed as the wiring of the rewiring layer, and the rewiring layer is disposed between the silicon layer and the solder bumps.

According to the embodiment of the technology, it is possible to meet needs in terms of large capacity, downsizing, and power saving.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, an embodiment of the technology disclosed herein will be described with reference to drawings.

Figure 1:
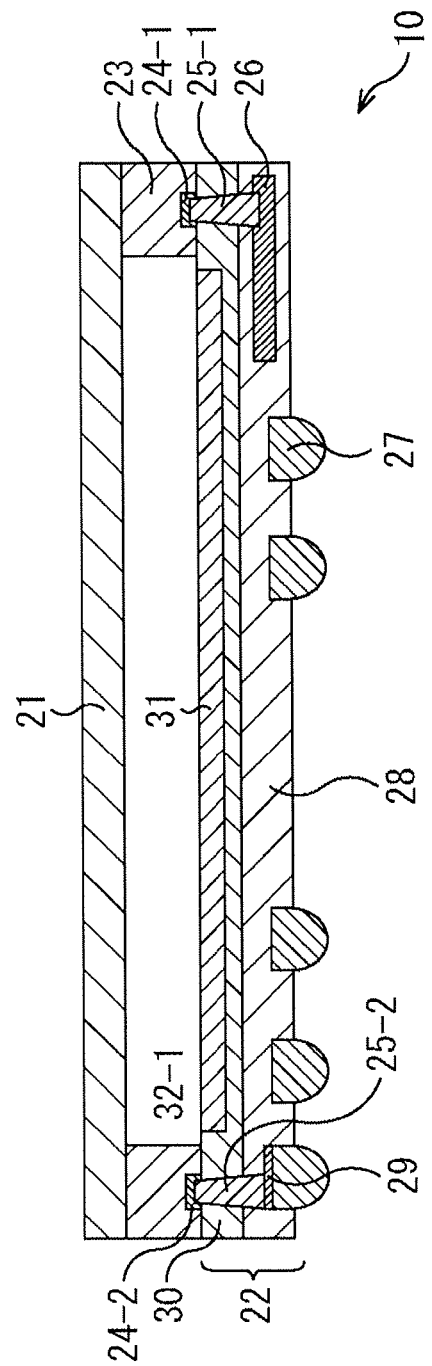
FIG. 1 is a sectional view illustrating a configuration example of an image sensor according to an embodiment of the technology.

FIG. 1 is a sectional view illustrating a configuration example of an image sensor according to an embodiment of the technology.

An image sensor 10 in FIG. 1 is configured as an image sensor of a so-called chip size package (CSP), and is configured by forming ribs 23 on a stacked sensor substrate 22 and displacing an on-chip lens (namely, a glass 21) thereon.

The sensor substrate 22 is mainly formed of a silicon layer 30 and an insulating layer 28, and a sensor section 31 is provided on the silicon layer 30. Solder bumps 27 are provided on a lower part of the insulating layer 28 so as to project downward.

For example, the solder bumps 27 may be used for connecting the image sensor 10 with external circuit substrates.

In addition, a metal rewiring layer 26 is formed inside the insulating layer 28. The rewiring layer 26 is to connect the solder bumps 27 with wirings and the like on a front surface of the sensor substrate 22. In this example, the rewiring layer 26 and a rewiring layer 29 are provided inside the insulating layer 28.

The rewiring layer 26 is connected with an aluminum pad 24-1 on the front surface of the sensor substrate 22 through a through via 25-1. The rewiring layer 29 is connected with an aluminum pad 24-2 on the front surface of the sensor substrate 22 through a through via 25-2.

In recent years, in electronic apparatuses such as a smart phone, a communication system for internal data transmission of the electronic apparatus has been changing from wired communication to wireless communication along with increase in internal communication speed. Therefore, realization of larger-volume data communication using a broadband is expected.

Performing internal communication of the electronic apparatus through the wireless communication may make it possible, for example, to considerably reduce the number of signal wirings on the circuit substrate, and to provide a number of advantages such as downsizing of the substrate and improvement in signal quality by stabilization of a power source and a ground. For example, a large number of flexible cables and signal wirings on a printed board that are used in an existing high-speed wired communication are unnecessary. In addition, an impedance matching to improve signal quality in the wired communication is unnecessary, and reduction in the number of components, dispelling of concern over manufacturing variation, and the like are expected.

Moreover, a millimeter waveband has been becoming available as a band used in the wireless communication for internal data transmission of the electronic apparatus, and communication using a broadband has been realized. In the wireless communication in the millimeter waveband, attenuation of radio waves easily occurs, which makes communication distance short. However, the wireless communication in the millimeter waveband is suitable for very close distance communication specialized for the internal communication of the electronic apparatus. For example, signals output from a signal process circuit and the like may be modulated by a carrier wave in the millimeter waveband to generate high frequency signals, and the high frequency signals may be transmitted and received between substrates through the antenna.

On the other hand, signal transmission and reception are performed through the antennae in the wireless communication, and it is important to reduce the installation space of the antennae as much as possible.

Therefore, in the embodiment of the present application, an antenna is formed in a rewiring layer of a CSP. For example, an antenna may be formed on the rewiring layer 26.

Figure 2:
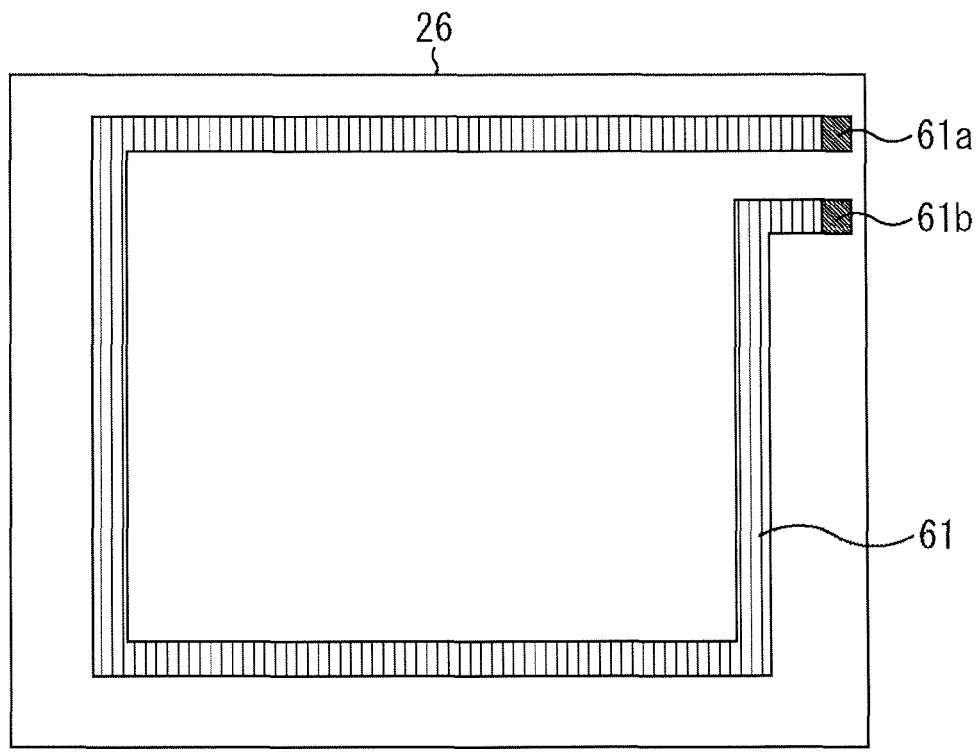
FIG. 2 is a diagram illustrating an example of an antenna formed in a rewiring layer.

FIG. 2 is a diagram illustrating an example of an antenna formed in the rewiring layer. In FIG. 2, a wiring 61 serving as the antenna formed on the rewiring layer 26 is illustrated. Note that, for example, the wiring 61 may be formed as a metal thin film or the like, and a minus terminal 61a and a plus terminal 61b are illustrated in a right end of FIG. 2.

In the case of the configuration illustrated in FIG. 2, the minus terminal 61a and the plus terminal 61b are internal circuits of the CSP, and for example, may be connected with an RF circuit formed on the silicon layer 30. In this case, for example, the RF circuit is a circuit to provide functions of modulation, demodulation, and the like that are necessary for the wireless communication. In other words, the RF circuit and the antenna are formed inside the image sensor 10 that is configured as the CSP. This makes it possible to effectively use an area of the chip and to achieve downsizing of the chip.

Note that, in the example of FIG. 2, although the shape of the wiring 61 forming a rectangular loop antenna is illustrated, for example, a linear antenna or a plate antenna may be formed.

Figure 3:
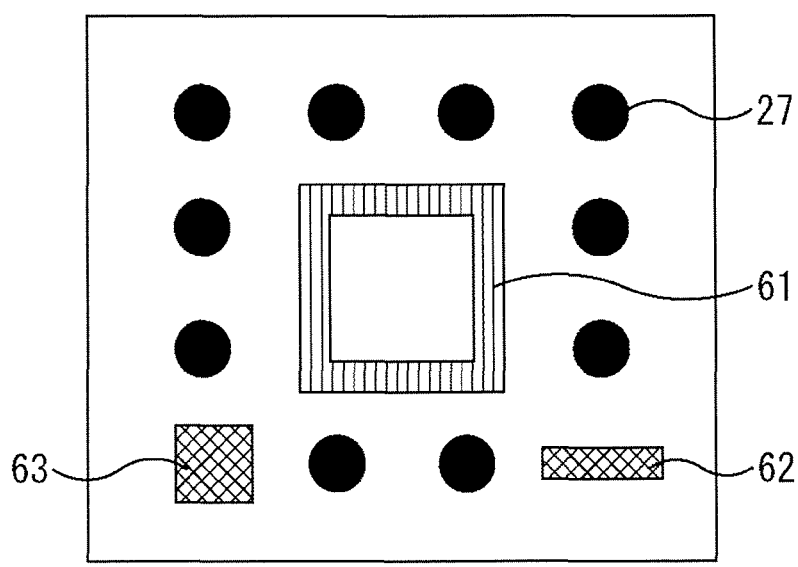
FIG. 3 is a diagram to explain an example of positional relationship between an antenna formed in the rewiring layer and solder bumps.

FIG. 3 is a diagram to explain an example of positional relationship between the antenna formed on the rewiring layer and the solder bumps 27.

As described above, in the case where the RF circuit and the antenna are formed inside the image sensor 10 that is configured as the CSP, the minus terminal 61a and the plus terminal 61b of the antenna are connected with the RF circuit formed on the silicon layer 30. Therefore, it is unnecessary to connect the minus terminal 61a and the plus terminal 61b with the solder bumps 27. Accordingly, as illustrated in FIG. 3, it is only necessary to form the antenna at a position where the solder bumps are not formed.

Note that, for simplification of description, the wiring forming the antenna and the solder bumps are illustrated on the same plane in FIG. 3, but are actually formed on different layers from each other.

In the example of FIG. 3, the wiring 61 forming the loop antenna on the rewiring layer, a wiring 62 forming a linear antenna on the rewiring layer, and a wiring 63 forming a plate antenna on the rewiring layer are illustrated. The wiring 61 to the wiring 63 are all formed at positions where the solder bumps 27 are not formed.

Figure 4:
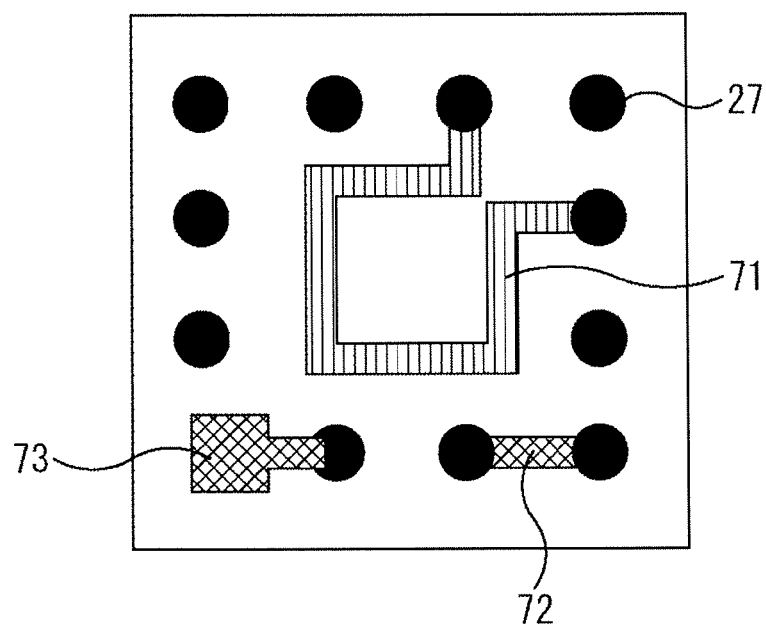
FIG. 4 is a diagram to explain another example of the positional relationship between the antenna formed in the rewiring layer and the solder bumps.

Alternatively, the RF circuit may be disposed outside the CSP. With this configuration, for example, the configuration of the CSP may be simplified, and cost reduction may be achieved. FIG. 4 is a diagram to explain another example of the positional relationship between the antenna formed on the rewiring layer 26 and the solder bumps 27.

In the case where the antenna is formed inside the image sensor 10 that is configured as the CSP, and the antenna is connected with the RF circuit provided outside the CSP, it is necessary to connect the minus terminal 61a and the plus terminal 61b of the antenna with the solder bumps 27. Therefore, as illustrated in FIG. 4, it is only necessary to form the terminals of the antenna at positions where the solder bumps 27 are formed.

In the example of FIG. 4, a wiring 71 forming a loop antenna on the rewiring layer, a wiring 72 forming a linear antenna on the rewiring layer, and a wiring 73 forming a plate antenna on the rewiring layer are illustrated. The wiring 71 to the wiring 73 are all formed to allow terminals of the respective antennae to be located at positions where the solder bumps 27 are formed.

As described above, in the embodiment of the present application, the antenna is formed on the rewiring layer 26. Therefore, it is possible to simplify the wiring design as compared with the case where, for example, an antenna is formed as a wiring of the silicon layer 30.

Specifically, wirings used for various kinds of circuits in the image sensor are previously formed on the silicon layer 30, and it is difficult to form an antenna without affecting such a wiring pattern. In contrast, in the embodiment of the present application, it is possible to freely arrange the antenna without restriction by the wirings of the silicon layer 30, and to effectively use an area of the chip to achieve downsizing thereof.

Moreover, as described above with reference to FIG. 1, if signal input and output through the wireless communication is possible in the image sensor 10, for example, sorting operation through the wireless communication may be performed in a process of product sorting. In other words, sorting of the CSP may be performed through a conduction test and the like in a non-contact manner, for example, which makes it possible to remarkably simplify processes relating to the tests to reduce costs, and to avoid deterioration in manufacturing yield caused by needle track of a probe.

Figure 5:
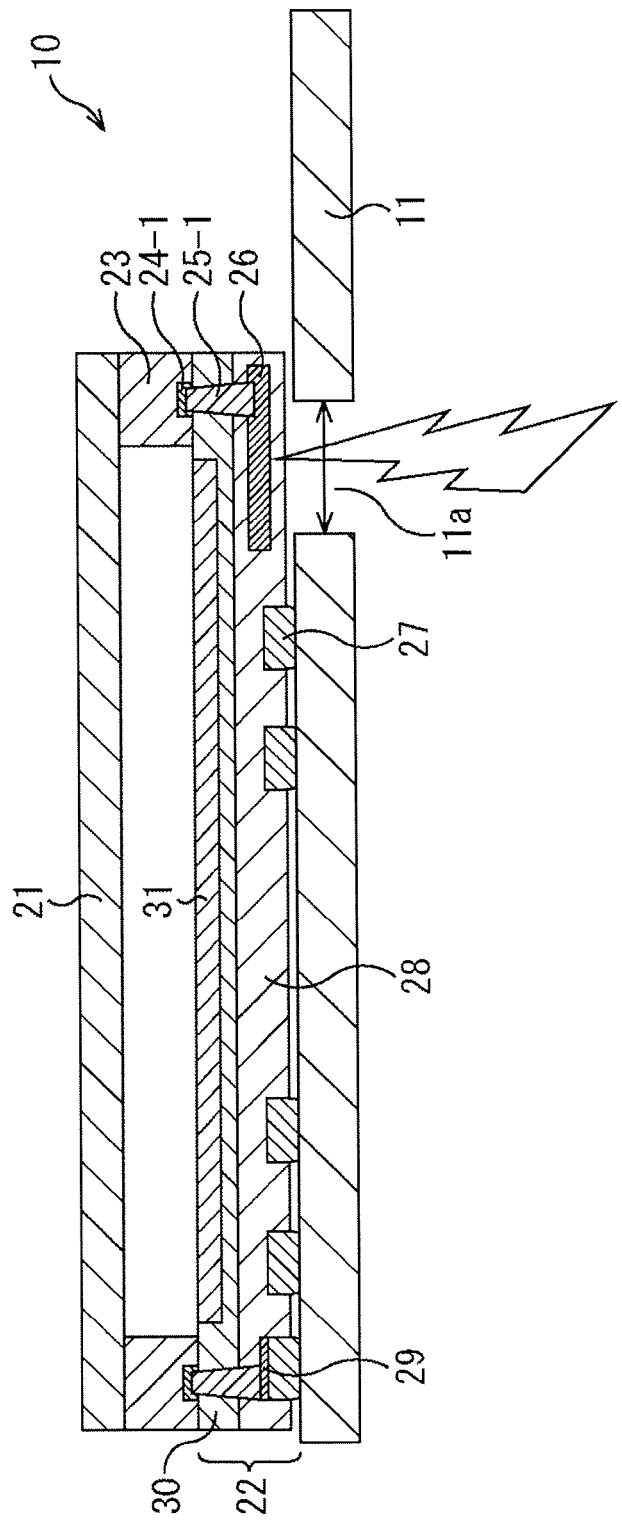
FIG. 5 is a sectional view illustrating configuration example in a case where an image sensor to which the present application is applied is disposed on a mounting substrate.

FIG. 5 is a sectional view illustrating a configuration example in the case where the image sensor 10 to which the present application is applied is disposed on a mounting substrate 11.

In the example of FIG. 5, the image sensor 10 that is configured as the CSP is disposed on the mounting substrate 11, and the image sensor 10 and the mounting substrate 11 are electrically connected with each other by the solder bumps 27. Chips other than the image sensor 10 are appropriately arranged on the mounting substrate 11, and such chips and the image sensor 10 are electrically connected with one another though wirings formed on the mounting substrate 11.

In addition, in the example of FIG. 5, a hole 11a is formed on the mounting substrate 11. The hole 11a is formed by hollowing a part of the mounting substrate 11.

As described above, since the antenna of the image sensor 10 is formed on the rewiring layer 26, the hole 11a is formed at a part of the mounting substrate 11 corresponding to the position of the rewiring layer 26. As described above, the wirings are formed on the mounting substrate 11, and the wirings are formed as metal thin films and the like. The hole 11a is formed so that radio waves emitted from the antenna of the image sensor 10 are not absorbed or blocked by the wirings formed on the mounting substrate 11, and the like.

As illustrated in FIG. 5, on the mounting substrate 11a, the hole 11a is formed at the position corresponding to the rewiring layer 26 that is provided with the antenna of the image sensor 10, which makes it possible to improve quality of the wireless communication.

Figure 6:
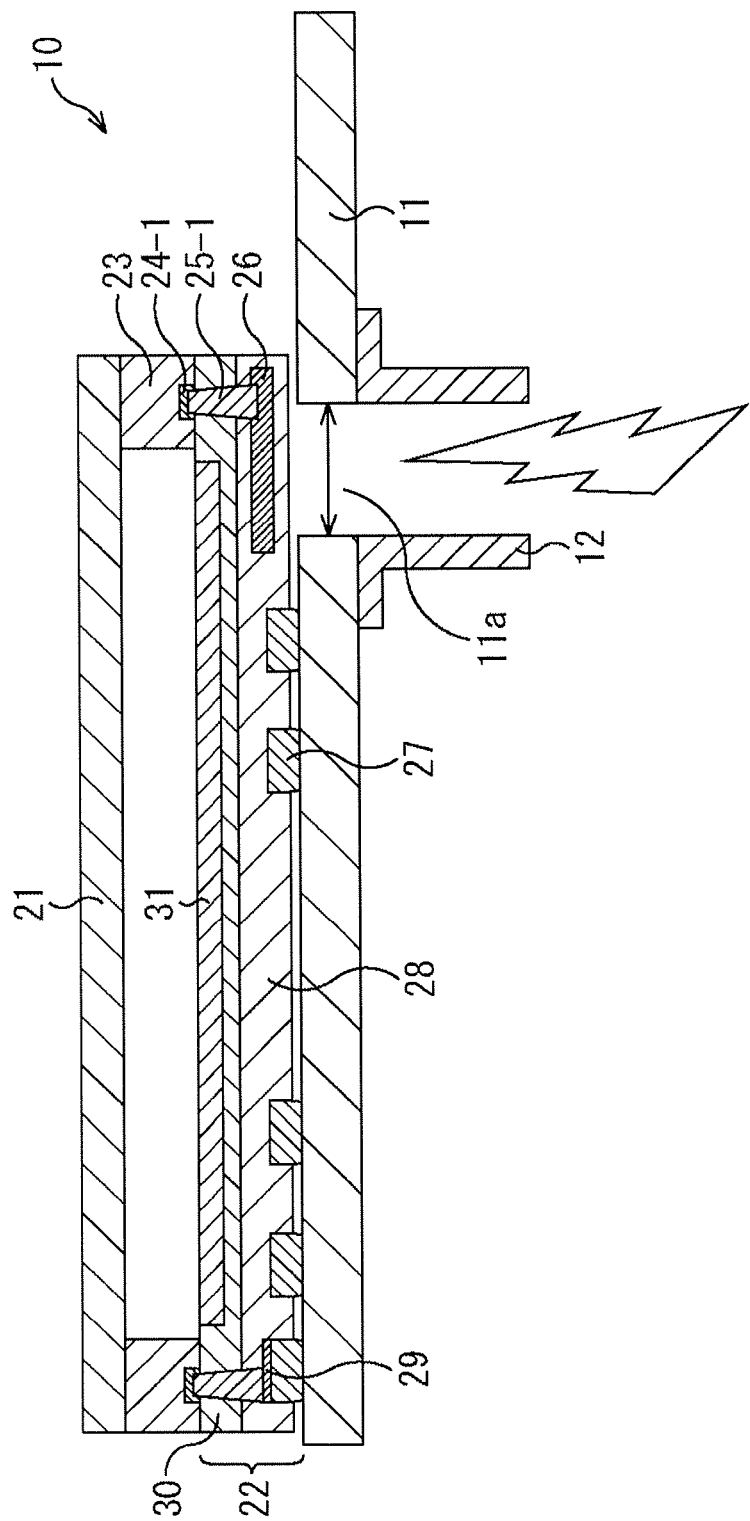
FIG. 6 is a sectional view illustrating another configuration example in the case where the image sensor to which the present application is applied is disposed on the mounting substrate.

FIG. 6 is a sectional view illustrating another configuration example in the case where the image sensor 10 to which the present application is applied is disposed on the mounting substrate 11.

Also in the example of FIG. 6, similarly to the case of FIG. 5, the image sensor 10 that is configured as the CSP is disposed on the mounting substrate 11, and the image sensor 10 and the mounting substrate 11 are electrically connected with each other by the solder bumps 27. In addition, as with the case of FIG. 5, the hole 11a is formed on the mounting substrate 11.

In the case of the example in FIG. 6, unlike the case of FIG. 5, a horn antenna 12 is provided at the position corresponding to the hole 11a. For example, the horn antenna 12 may be formed of a metallic material, and may have a shape opened downward in FIG. 6. The radio waves are transmitted through the horn antenna 12, which makes it possible to enhance intensity of the radio waves and to enhance directivity thereof.

As illustrated in FIG. 6, on the mounting substrate 11, the hole 11a is formed at the position corresponding to the rewiring layer 26 that is provided with the antenna of the image sensor 10, and the horn antenna 12 is further provided, which makes it possible to further improve the quality of the wireless communication, and to reduce power consumption in the wireless communication.

Hereinbefore, although the case where the present application is applied to an image sensor that is configured as a CSP has been described, the present application may be applied to other chips.

Note that the above described series of processes in the present specification include not only processes performed in time series in the described order but also processes not necessarily performed in time series but performed in parallel or individually.

Moreover, the embodiment of the present application is not limited to the above-described embodiment, and various modifications may be made within the scope of the appended claims or the equivalents thereof.

Note that the present application may be configured as follows.

(1) A chip size package (CSP) including
an antenna for wireless communication, used in signal transmission and reception with external substrates, the antenna being formed as a wiring of a rewiring layer, the rewiring layer being disposed between a silicon layer and solder bumps.

(2) The CSP according to (1), wherein
the antenna is connected to a circuit provided inside the CSP, and the wiring of the rewiring layer configuring the antenna is formed at a position where the solder bumps are not formed.

(3) The CSP according to (1), wherein
the antenna is connected to a circuit provided outside the CSP, and
the wiring of the rewiring layer configuring the antenna has ends formed at positions where the solder bumps are formed.

(4) The CSP according to any one of (1) to (3), wherein
the CSP is mounted on a mounting substrate, and
a part of the mounting substrate corresponding to the wiring of the rewiring layer configuring the antenna is hollowed, and a hole is provided at the hollowed part.

(5) The CSP according to (4), wherein a horn antenna is provided at a position corresponding to the hole of the mounting substrate.

(6) The CSP according to any one of (1) to (5), wherein the CSP is configured as an image sensor.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A chip size package (CSP) comprising
an antenna for wireless communication, used in signal transmission and reception with external substrates, the antenna being formed as a wiring of a rewiring layer, the rewiring layer being disposed between a silicon layer and solder bumps,
wherein the antenna is connected to a circuit provided outside the CSP, and
the wiring of the rewiring layer configuring the antenna has ends formed at positions where the solder bumps are formed.

2. The CSP according to claim 1, wherein
the antenna is connected to a circuit provided inside the CSP, and
the wiring of the rewiring layer configuring the antenna is formed at a position where the solder bumps are not formed.

3. A chip size package (CSP) comprising
an antenna for wireless communication, used in signal transmission and reception with external substrates, the antenna being formed as a wiring of a rewiring layer, the rewiring layer being disposed between a silicon layer and solder bumps,
wherein the CSP is mounted on a mounting substrate, and
a part of the mounting substrate corresponding to the wiring of the rewiring layer configuring the antenna is hollowed, and a hole is provided at the hollowed part.

4. The CSP according to claim 3, wherein a horn antenna is provided at a position corresponding to the hole of the mounting substrate.

5. A chip size package (CSP) comprising
an antenna for wireless communication, used in signal transmission and reception with external substrates, the antenna being formed as a wiring of a rewiring layer, the rewiring layer being disposed between a silicon layer and solder bumps, and
wherein the CSP is configured as an image sensor.

* * * * *